(12) United States Patent
Inoue

(10) Patent No.: US 6,989,305 B2
(45) Date of Patent: Jan. 24, 2006

(54) METHOD OF MANUFACTURING SEMICONDUCTOR DEVICE

(75) Inventor: Susumu Inoue, Sakata (JP)

(73) Assignee: Seiko Epson Corporation, Tokyo (JP)

( * ) Notice: Subject to any disclaimer, the term of this patent is extended or adjusted under 35 U.S.C. 154(b) by 149 days.

(21) Appl. No.: 10/636,582

(22) Filed: Aug. 8, 2003

(65) Prior Publication Data

US 2004/0072403 A1    Apr. 15, 2004

(30) Foreign Application Priority Data

Sep. 11, 2002   (JP)   .............................. 2002-265750

(51) Int. Cl.
*H01L 21/8247*   (2006.01)
(52) U.S. Cl. ..................... 438/267; 438/954
(58) Field of Classification Search ........ 438/257–267, 438/954
See application file for complete search history.

(56) References Cited

U.S. PATENT DOCUMENTS

| | | | |
|---|---|---|---|
| 5,408,115 | A | 4/1995 | Chang |
| 5,422,504 | A | 6/1995 | Chang et al. |
| 5,494,838 | A | 2/1996 | Chang et al. |
| 5,969,383 | A | 10/1999 | Chang et al. |
| 6,177,318 | B1 | 1/2001 | Ogura et al. |
| 6,248,633 | B1 | 6/2001 | Ogura et al. |
| 6,255,166 | B1 | 7/2001 | Ogura et al. |
| 6,413,821 | B1 | 7/2002 | Ebina et al. |
| 6,518,124 | B1 | 2/2003 | Ebina et al. |
| 6,627,491 | B2 | 9/2003 | Ebina et al. |
| 6,656,794 | B2 | 12/2003 | Shibata |
| 6,664,155 | B2 | 12/2003 | Kasuya |
| 2002/0100929 | A1 | 8/2002 | Ebina et al. |
| 2002/0127805 | A1 | 9/2002 | Ebina et al. |
| 2003/0057505 | A1 | 3/2003 | Ebina et al. |
| 2003/0058705 | A1 | 3/2003 | Ebina et al. |
| 2003/0060011 | A1 | 3/2003 | Ebina et al. |
| 2003/0157767 | A1 | 8/2003 | Kasuya |

(Continued)

FOREIGN PATENT DOCUMENTS

JP    A 07-161851    6/1995

(Continued)

OTHER PUBLICATIONS

U.S. Appl. No. 10/636,562, filed Aug. 8, 2003, Inoue.

(Continued)

*Primary Examiner*—Richard A. Booth
(74) *Attorney, Agent, or Firm*—Oliff & Berridge, PLC

(57) ABSTRACT

A method of manufacturing a semiconductor device including a memory region in which non-volatile memory devices are arranged in a matrix form of a plurality of rows and a plurality of columns to form a memory cell array, the method including the steps of: forming a gate insulation layer, a conductive layer that will form a word gate, and a stopper layer above a semiconductor layer; forming a first insulation layer over the entire surface of the memory region; forming a first control gate in the form of a side wall on each of both side surfaces of the word gate, with the first insulation layer interposed with respect to the semiconductor layer; etching the surface of the first control gate; using that first control gate as a mask to remove part of the first insulation layer, thus forming a second insulation layer; forming a third conductive layer over the entire surface of the memory region; and forming a second control gate on the side surface of the first control gate, with the second insulation layer interposed with respect to the semiconductor layer, by anisotropic etching of the third conductive layer.

6 Claims, 15 Drawing Sheets

U.S. PATENT DOCUMENTS

| | | |
|---|---|---|
| 2003/0166321 A1 | 9/2003 | Kasuya |
| 2003/0166322 A1 | 9/2003 | Kasuya |
| 2003/0190805 A1 | 10/2003 | Iniue |
| 2003/0211691 A1 | 11/2003 | Ueda |
| 2003/0235952 A1 * | 12/2003 | Shibata ........................ 438/257 |
| 2004/0005761 A1 * | 1/2004 | Shibata ........................ 438/261 |
| 2004/0129972 A1 * | 7/2004 | Kasuya ........................ 257/324 |
| 2005/0032312 A1 * | 2/2005 | Ebina et al. ................. 438/257 |

FOREIGN PATENT DOCUMENTS

| | | |
|---|---|---|
| JP | B1 2978477 | 9/1999 |
| JP | A 2001-156188 | 6/2001 |

OTHER PUBLICATIONS

U.S. Appl. No. 10/689,987, filed Oct. 22, 2003, Kasuya.
U.S. Appl. No. 10/636,581, filed Aug. 8, 2003, Yamamukai.
U.S. Appl. No. 10/636,582, filed Aug. 8, 2003, Inoue.
U.S. Appl. No. 10/614,985, filed Jul. 9, 2003, Inoue.
U.S. Appl. No. 10/689,990, filed Oct. 22, 2003, Kasuya.
U.S. Appl. No. 10/689,993, filed Oct. 22, 2003, Kasuya.
U.S. Appl. No. 10/690,025, filed Oct. 22, 2003, Kasuya.
Wei-Ming Chen et al. "A Novel Flash Memory Device with S Plit Gate Source Side Injection and ONO Charge Storage Stack (SPIN)", 1997, Symposium on VLSI Technology Digest of Technical Papers, pp. 63-64.
Yutaka Hayashi et al. "Twin MONOS Cell with Dual Control Gates", 2000, Symposium on VLSI Technology Digest of Technical Papers.
Kuo-Tung Chang et al. "A New SONOS Memory Using Source-Side Injection for Programming", IEEE Electron Device Letters, vol. 19, No., 7, Jul. 1998, pp. 253-255.

* cited by examiner

METHOD OF MANUFACTURING SEMICONDUCTOR DEVICE

Japanese Patent Application No. 2002-265750, filed on Sep. 11, 2002, is hereby incorporated by reference in its entirety.

BACKGROUND OF THE INVENTION

The present invention relates to a method of manufacturing a semiconductor device that includes a memory region, and, in particular, to a method of manufacturing a semiconductor device in which a non-volatile memory device formed within a memory region has two charge accumulation regions for each word gate One type of non-volatile semiconductor memory device is called a metal-oxide-nitride-oxide semiconductor (MONOS) type or a silicon-oxide-nitride-oxide-silicon (SONOS) type, in which a gate insulation layer between a channel region and a control gate is formed of a multi-layer stack of silicon oxide and silicon nitride layers, and charge is trapped in the silicon nitride layer.

A device shown in FIG. 14 is known as an example of this MONOS type of non-volatile semiconductor memory device (disclosed by Y. Hayashi, et al, in 2000 Symposium on VLSI Technology Digest of Technical Papers, pp. 122–123).

In this MONOS memory cell 100, a word gate 14 is formed on a semiconductor substrate 10 with a gate insulation layer 12 therebetween. A control gate 20 and a control gate 30 are disposed on either side of the word gate 14, in the shape of side walls. There is an insulation layer 22 between a base portion of the control gate 20 and the semiconductor substrate 10, and a side insulation layer 26 between a side surface of the control gate 20 and the word gate 14. In a similar manner, the insulation layer 22 is between a base portion of the control gate 30 and the semiconductor substrate 10, and the side insulation layer 26 is between a side surface of the control gate 30 and the word gate 14. Impurity layers 16 and 18, which are to form a source region and drain region, are formed in the semiconductor substrate 10 between the opposing control gates 20 and 30 of neighboring memory cells.

In this manner, each memory cell 100 has two MONOS memory elements on the side surfaces of the word gate 14. These two MONOS memory elements can be controlled independently. Thus one memory cell 100 can store two bits of information.

BRIEF SUMMARY OF THE INVENTION

The present invention may provide a method of manufacturing a semiconductor device that is a semiconductor device comprising a MONOS type of non-volatile memory device having two charge accumulation regions and, in particular, having resistance to deterioration during the writing/erasing of data.

A method of manufacturing a semiconductor device in accordance with the present invention relates to a method of manufacturing a semiconductor device comprising a memory region in which non-volatile memory devices are arranged in a matrix form of a plurality of rows and a plurality of columns to form a memory cell array, the method of manufacturing a semiconductor device comprising the steps of:

(a) forming a gate insulation layer above a semiconductor layer;

(b) forming a first conductive layer above the gate insulation layer;

(c) forming a stopper layer above the first conductive layer;

(d) patterning the stopper layer and the first conductive layer, to form a stack of layers formed of that stopper layer and that first conductive layer;

(e) forming a first insulation layer at least over the semiconductor layer and both side surfaces of the first conductive layer;

(f) forming a second conductive layer over an entire surface of the memory region, and forming a first control gate in the form of a side wall on each of two opposed side surfaces of the first conductive layer, with the first insulation layer interposed with respect to the semiconductor layer, by anisotropic etching of the second conductive layer;

(g) removing oxide films from a surface of the first control gate;

(h) using the first control gate as a mask to remove part of the first insulating layer, and defining part of the remaining first insulating layer under the removed portion as a second insulating layer;

(i) forming a third conductive layer over the entire surface of the memory region;

(j) forming a second control gate on a side surface of the first control gate, with the second insulation layer interposed with respect to the semiconductor layer, by anisotropic etching of the third conductive layer;

(k) forming an impurity layer to be a source region or a drain region within the semiconductor layer;

(l) forming a third insulation layer over the entire surface of the memory region then removing the third insulation layer to expose at least part of the stopper layer; and (m) removing the stopper layer, then forming a fourth conductive layer and patterning the fourth conductive layer to form a word line.

DETAILED DESCRIPTION OF THE EMBODIMENT

Figure 1:
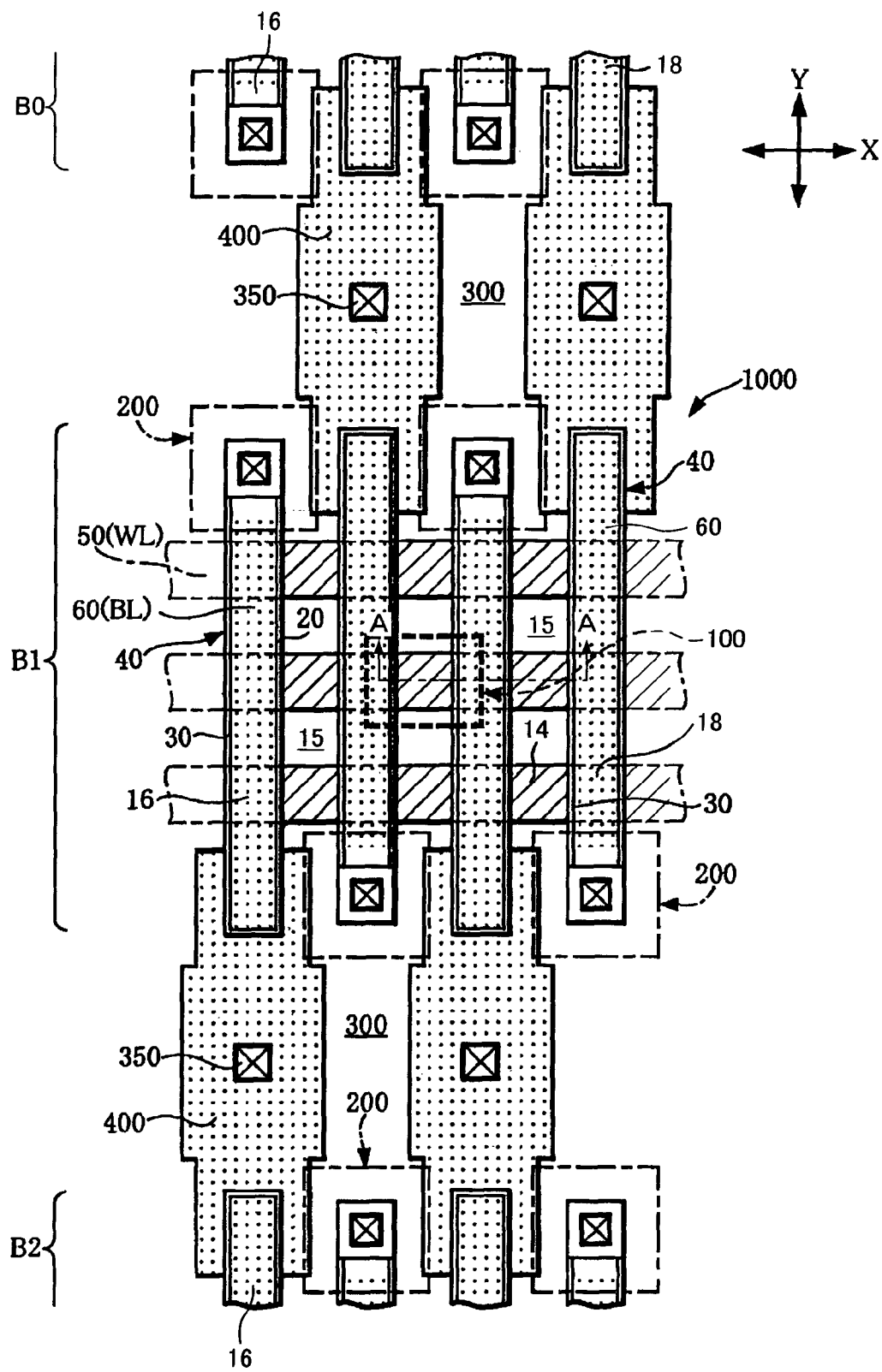
FIG. 1 is a schematic plan view of the layout of the memory region of a semiconductor device.

A method of manufacturing a semiconductor device in accordance with an embodiment of the present invention relates to a method of manufacturing a semiconductor device comprising a memory region in which non-volatile memory devices are arranged in a matrix form of a plurality of rows and a plurality of columns to form a memory cell array, the method of manufacturing a semiconductor device comprising the steps of:

(a) forming a gate insulation layer above a semiconductor layer;

(b) forming a first conductive layer above the gate insulation layer;

(c) forming a stopper layer above the first conductive layer;

(d) patterning the stopper layer and the first conductive layer, to form a stack of layers formed of that stopper layer and that first conductive layer;

(e) forming a first insulation layer at least over the semiconductor layer and both side surfaces of the first conductive layer;

(f) forming a second conductive layer over an entire surface of the memory region, and forming a first control gate in the form of a side wall on each of two opposed side surfaces of the first conductive layer, with the first insulation layer interposed with respect to the semiconductor layer, by anisotropic etching of the second conductive layer;

(g) removing oxide films from a surface of the first control gate;

(h) using the first control gate as a mask to remove part of the first insulating layer, and defining part of the remaining first insulating layer under the removed portion as a second insulating layer;

(i) forming a third conductive layer over the entire surface of the memory region;

(j) forming a second control gate on a side surface of the first control gate, with the second insulation layer interposed with respect to the semiconductor layer, by anisotropic etching of the third conductive layer;

(k) forming an impurity layer to be a source region or a drain region within the semiconductor layer;

(l) forming a third insulation layer over the entire surface of the memory region then removing the third insulation layer to expose at least part of the stopper layer; and (m) removing the stopper layer, then forming a fourth conductive layer and patterning the fourth conductive layer to form a word line.

The method of manufacturing a semiconductor device in accordance with this embodiment ensures that each control gate is formed by a two-stage process. More specifically, a first control gate is formed above a first insulation layer and then a second insulation layer is formed by removing part of the first insulation layer. The control gate is completed by forming a second control gate above the second insulation layer. Thus the control gate is formed above insulation layers of different film thicknesses. As a result, it is possible to manufacture a semiconductor device in which the field strength of the control gate and the substrate surface is non-uniform.

The method of manufacturing a semiconductor device in accordance with this embodiment may have the features described below.

(A) In the method of manufacturing a semiconductor device in accordance with this embodiment, step (g), step (h), and step (i) may be performed in sequence, without exposing an object being processed to the atmosphere.

(B) In the method of manufacturing a semiconductor device in accordance with this embodiment, step (j) may comprise etching the first control gate.

(C) In the method of manufacturing a semiconductor device in accordance with this embodiment, the third insulation layer may be removed in step (l) by polishing.

(D) In the method of manufacturing a semiconductor device in accordance with this embodiment, the first insulation layer may be a stack of a first silicon oxide film, a silicon nitride film, and a second silicon oxide film.

(E) In the method of manufacturing a semiconductor device in accordance with this embodiment, the second insulation layer may be a stack of a silicon oxide film and a silicon nitride film.

The method of manufacturing a semiconductor device in accordance with this embodiment is described in detail below.

1. Configuration of Semiconductor Device

A plan view of the layout of a semiconductor device obtained by the manufacture method in accordance with the embodiment of the present invention is shown in FIG. 1. The semiconductor device includes a memory region 1000 having a non-volatile memory device.

MONOS type non-volatile memory devices (hereinafter called "memory cells") are disposed within the memory region 1000 in a matrix of a plurality of rows and columns. A first block B1 and parts of blocks B0 and B2 adjacent thereto are shown in this memory region 1000. The blocks B0 and B2 are configured opposite to block B1.

An element isolation region 300 is formed in each partial region between the first block B1 and the adjacent block B0 or B2. Each block is provided with a plurality of word lines 50 (WL) extending in an X direction (row direction) and a plurality of bit lines 60 (BL) extending in a Y direction (column direction). Each word line 50 is connected to a plurality of word gates 14 disposed in the X direction. Each bit line 60 is configured of impurity layers 16 and 18.

A conductive layer 40 that forms control gates 20 and 30 is formed so as to surround each of the impurity layers 16 and 18. In other words, the control gates 20 and 30 each extend in the Y direction and the portions at one end of the pair of control gates 20 and 30 are connected together by the conductive layer extending in the X direction. The other end portions of each pair of the control gates 20 and 30 are connected to one common contact portion 200. Thus, the conductive layer 40 functions both as a control gate for a memory cell and as interconnect that connects the control gates that are arrayed in the Y direction.

A single memory cell 100 includes one word gate 14, the control gates 20 and 30, and the impurity layers 16 and 18.

The control gates 20 and 30 are formed on either side of the word gate 14. The impurity layers 16 and 18 are formed on the outer sides of the control gates 20 and 30. The impurity layers 16 and 18 are owned in common by adjacent memory cells 100.

The impurity layer 16 formed in block B1 and the impurity layer 16 formed in block B2, which are impurity layers 16 that are mutually adjacent in the Y direction, are electrically connected together by a contact impurity layer 400 that is formed in the semiconductor substrate. This contact impurity layer 400 is formed on the opposite side of the impurity layer 16 from a common contact section 200.

A contact 350 is formed on top of this contact impurity layer 400. The bit line 60 formed by the impurity layer 16 is connected electrically to an interconnection layer in an upper layer by this contact 350.

Similarly, two impurity layers 18 that are mutually adjacent in the Y direction (the impurity layer 18 formed in block B1 and the impurity layer 18 formed in block B0) are electrically connected by the contact impurity layer 400 on the sides on which the common contact portions 200 are not disposed. As can be seen from FIG. 1, the layout in plan of a plurality of the common contact portions 200 in one block is formed on alternating sides of the impurity layers 16 and the impurity layers 18, in a zigzag arrangement. The layout in plan of a plurality of the contact impurity layers 400 is formed on alternating sides of the impurity layers 16 and the impurity layers 18, in a zigzag arrangement.

Figure 2:
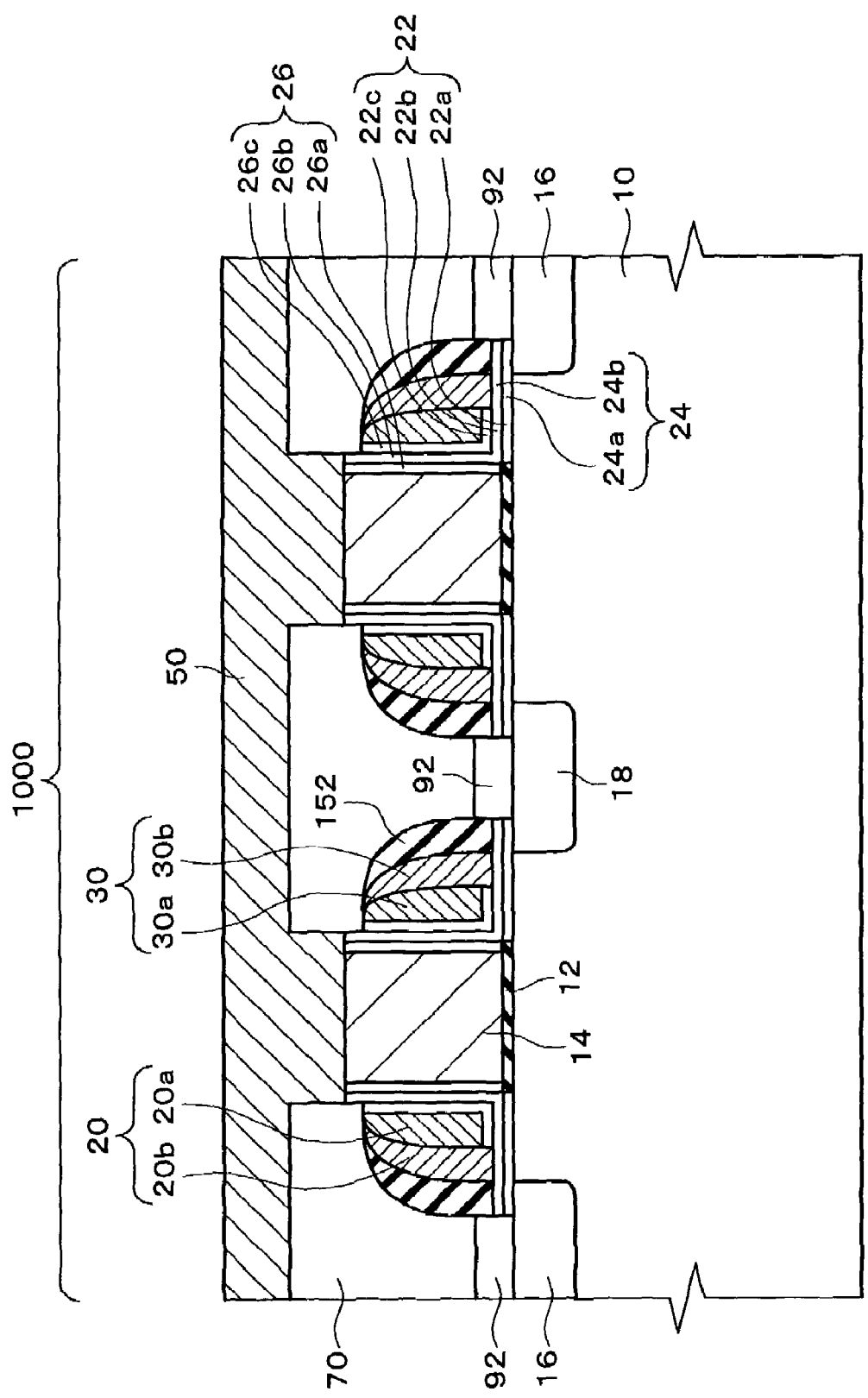
FIG. 2 is a schematic section taken along the line A—A of FIG. 1.

The description now turns to the configuration of the semiconductor device in section, with reference to FIG. 2. FIG. 2 is a section taken along the line A—A of FIG. 1.

The memory cell 100 in the memory region 1000 includes the word gate 14, the impurity layers 16 and 18, and the control gates 20 and 30. The word gate 14 is formed above the semiconductor substrate 10 with a gate insulation layer 12 therebetween. The impurity layers 16 and 18 are formed within the semiconductor substrate 10. Each impurity layer will form a source region or a drain region. A silicide layer 92 is formed above the impurity layers 16 and 18.

The control gates 20 and 30 are formed on either side of the word gate 14. The control gate 20 is formed of a first control gate 20a and a second control gate 20b in mutual contact. The first control gate 20a is formed above the semiconductor substrate 10 with a first insulation layer 22 therebetween and is also formed on one side surface of the word gate 14 with a side insulation layer 26 therebetween. The second control gate 20b is formed above the semiconductor substrate with a second insulation layer 24 therebetween. Similarly, the control gate 30 is formed of a first control gate 30a and a second control gate 30b.

The first insulation layer 22 is an ONO film. More specifically, the first insulation layer 22 is a stack of a bottom silicon oxide layer (first silicon oxide layer) 22a, a silicon nitride layer 22b, and a top silicon oxide layer (second silicon oxide layer) 22c, in sequence from the semiconductor substrate 10 side.

The second insulation layer 24 is an NO film. More specifically, the second insulation layer 24 is a stack of a bottom silicon oxide layer (first silicon oxide layer) 24a and a silicon nitride layer 24b.

The first silicon oxide layer 22a forms a potential barrier between a channel region and a charge accumulation region. The silicon nitride layer 22b functions as a charge accumulation region that traps carriers (such as electrons). The second silicon oxide layer 22c forms a potential barrier between the control gate and the charge accumulation region.

The side insulation layer 26 is an ONO film. More specifically, the side insulation layer 26 is a stack of a first silicon oxide layer 26a, a silicon nitride layer 26b, and a second silicon oxide layer 26c, in sequence from the word gate 14 side. The side insulation layer 26 isolates the word gate 14 electrically from each of the control gates 20 and 30. The upper edge of at least the first silicon oxide layer 26a of the side insulation layer 26 is positioned higher above the semiconductor substrate 10 than the upper edges of the control gates 20 and 30 in order to prevent any short-circuiting between the word gate 14 and the control gates 20 and 30.

The side insulation layer 26 and the first insulation layer 22 have a similar stack configuration.

The surface of each of the control gates 20 and 30 is covered by a side-wall insulation layer 152.

An embedded insulation layer 70 is formed between the neighboring control gate 20 and control gate 30 of adjacent memory cells 100. This embedded insulation layer 70 covers them in such a manner that at least the control gates 20 and 30 are not exposed. In addition, the upper surface of the embedded insulation layer 70 is positioned higher above the semiconductor substrate 10 than the upper surface of the word gate 14. Forming the embedded insulation layer 70 in this manner makes it possible to provide reliable electrical isolation between the control gates 20 and 30 and the word gate 14 and the word line 50.

The word line 50 is formed above the word gate 14 as shown in FIG. 2.

In the semiconductor device obtained by the manufacture method in accordance with this embodiment, each of the control gates 20 and 30 is formed of the first control gates 20a and 30a and the second control gates 20b and 30b that are formed above insulation layers of different film thicknesses. For that reason, the potential of the substrate surface below the control gates 20 and 30 also changes in a two-stage manner, and the field strength has peaks in three types of locations: the boundaries between the word gate 14 and the control gates 20 and 30, the boundaries between the first control gates 20a and 30a and the second control gates 20b and 30b, and the edge portions of the impurity regions. This has advantages relating to the writing and erasing of data with respect to the memory cell 100, as described below.

The description first concerns data write. During data write, electrons that have migrated into the impurity region 16 receive energy at the boundary between the word gate 14 and the control gate 30 and again receive energy at the boundary region between the first control gate 30a and the second control gate 30b, to become hot electrons, and are implanted and trapped in the first insulation layer 22 in the vicinity of the stepped portion.

In the semiconductor device in accordance with this embodiment, the positions at which the electrons are implanted are distributed about the center of the boundary portion of the first control gate 30a and the second control gate 30b. Since the second insulation layer 24 formed of an NO film is below the second control gate 30b, however, the charge escapes to the control gate 30. As a result, the electrons trapped on the first control gate 30a side remain.

Figure 15:
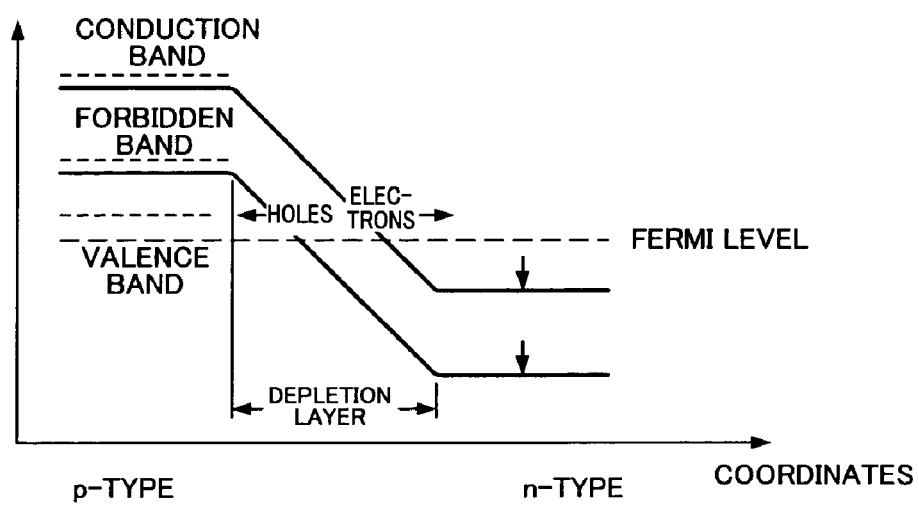
FIG. 15 is illustrative of the operation of erasing in the semiconductor device in accordance with the present invention.

The description now turns to data erasure, with reference to FIG. 15. FIG. 15 is a band chart with the potential energy of electrons along the vertical axis and actual spatial coordinates along the horizontal axis at the edge of the impurity layer 18, in other words, the state at a pn junction portion.

First of all, a high positive voltage is applied to the impurity layer 18 and a negative voltage is applied to the control gate 30. As a result, the potential energy of electrons in the impurity layer 18 that is an n-type region is reduced (the potential energy of the electrons in the n-type region shift in the direction of the arrow in FIG. 15). In the high-density pn junction, the thickness of the depleted layer is extremely small at only a few nm, making it possible for the electrons in the p-type electron band to migrate by the tunneling effect into the n-type conductive band. In other words, positive holes are created in the vicinity of the edge of the impurity layer 18, which is a p-type region, as the electrons migrate. This means that a hole accumulation layer is formed in the vicinity of the edge of the impurity layer.

In this case, attention is drawn to the electrical fields between the second control gate 30b formed above the second insulation layer 24 and the first control gate 30a formed above the first insulation layer 22, and the substrate surface. Since the hole accumulation layer is formed in the second insulation layer 24, carrier conductivity is high. Thus the electrical field in the lateral direction (in the longitudinal gate direction) is relatively low. Since the second insulation layer 24 is thinner than the first insulation layer 22, the electrical field in the orthogonal direction is relatively high. Thus the holes that are created in the vicinity of the edge of the impurity layer 18 cannot jump into the second insulation layer 24.

In the first insulation layer 22 region, on the other hand, the electrical field is relatively high in the lateral direction but relatively low in the orthogonal direction. Thus the holes that are created in the vicinity of the edge of the impurity layer 18 have a large amount of energy in the boundary between the second insulation layer 24 region and the first insulation layer 22 region, and jump into the charge accumulation film. In other words, holes are implanted into locations close to a region where the thickness of the charge accumulation film is different, and erasing is done at those positions.

This makes it possible to ensure that the positions at which electrons are implanted during writing match the positions at which holes are implanted during erasure. As a result, it is possible to implement a non-volatile memory device that does not deteriorate even during repetitions of the write/erase cycle.

2. Method of Manufacturing Semiconductor Device

The description now turns to a method of manufacturing the semiconductor device in accordance with this embodiment, with reference to FIGS. 3 to 13. Each section corresponds to the portion taken along the line A—A of FIG. 1. In FIGS. 3 to 13, the same reference numbers are used to denote substantially the same portions as those shown in FIGS. 1 and 2, and redundant description is omitted.

(1) First of all, the element isolation region 300 is formed by a trench isolation method in the surface of the semiconductor substrate 10 (see FIG. 1). Ions of a p-type impurity are then implanted as channel doping. The contact n-type impurity layer 400 (see FIG. 1) is then formed in the semiconductor substrate 10.

Figure 3:
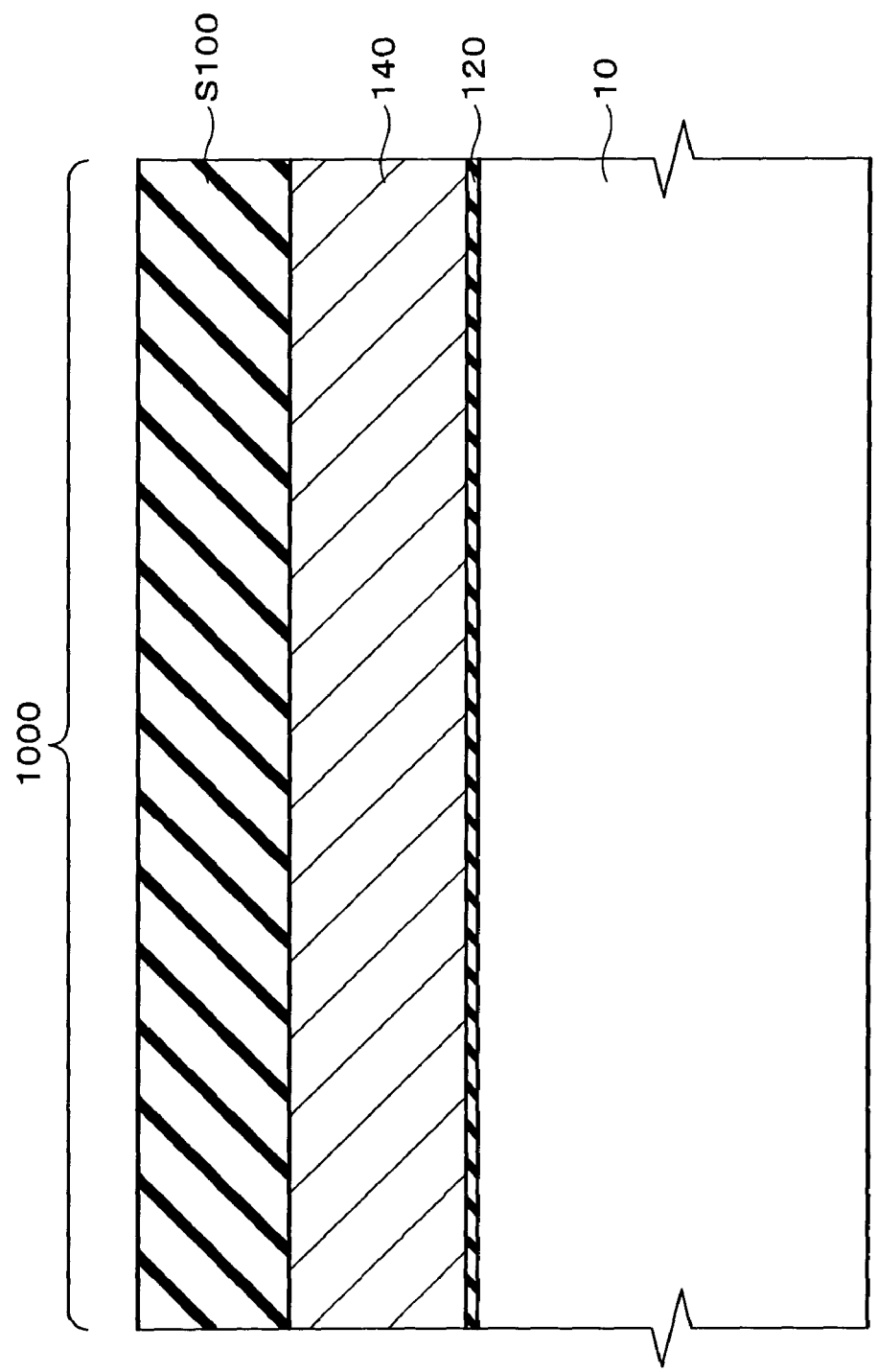
FIG. 3 is a sectional view of one step in the method of manufacturing the semiconductor device shown in FIGS. 1 and 2.

An insulation layer 120 that will form the gate insulation layer is then formed on the surface of the semiconductor substrate 10, as shown in FIG. 3. A gate layer (first conductive layer) 140 that will form the word gate 14 is deposited over the insulation layer 120. The gate layer 140 is formed of doped polysilicon. Then a stopper layer S100, which is used in the later CMP step, is then formed on the gate layer 140. The stopper layer S100 is formed from a silicon nitride layer.

Figure 4:
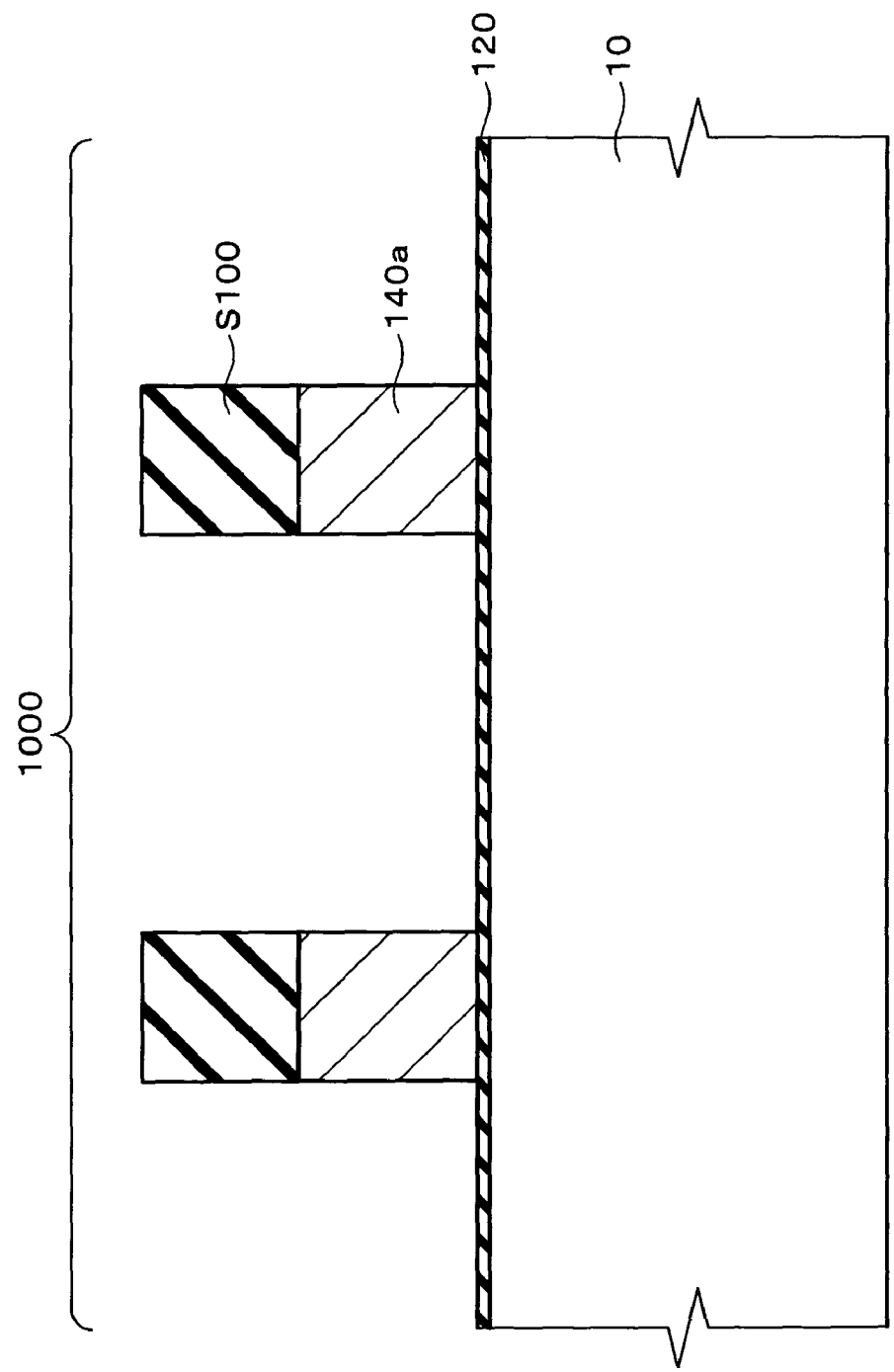
FIG. 4 is a sectional view of one step in the method of manufacturing the semiconductor device shown in FIGS. 1 and 2.

(2) A resist layer (not shown in the figure) is then formed. This resist layer is used as a mask for patterning the stopper layer S100. The thus-patterned stopper layer S100 is used as a mask for etching the gate layer 140. As shown in FIG. 4, the gate layer 140 is patterned to form a gate layer (word gate) 140a.

Figure 5:
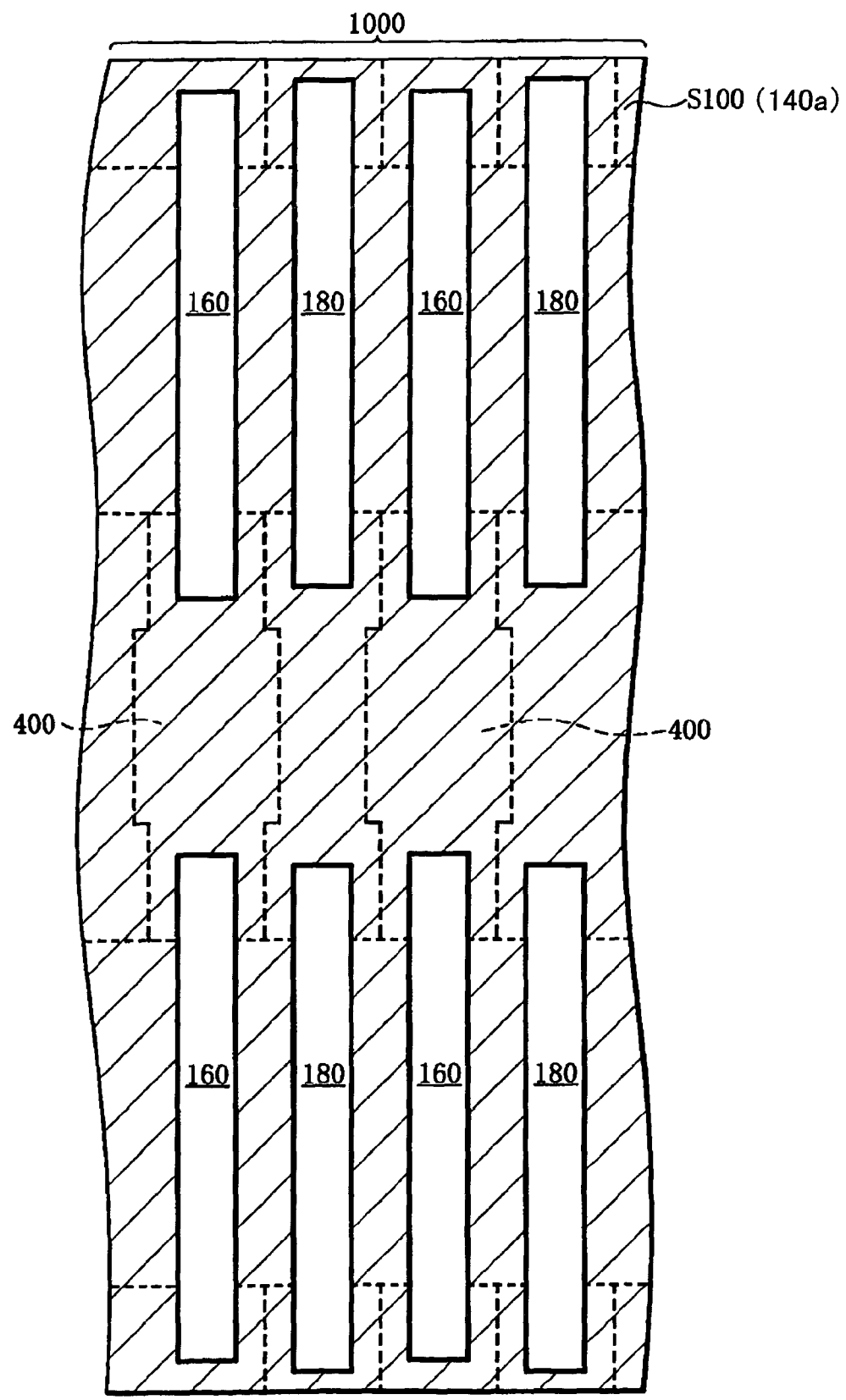
FIG. 5 is a plan view of the step in the method of manufacturing a semiconductor device shown in FIG. 4.

The status after the patterning is shown in plan view in FIG. 5. Aperture portions 160 and 180 are provided by this patterning in the stack formed by the gate layer 140a and the stopper layer S100 within the memory region 1000. The aperture portions 160 and 180 correspond substantially to regions in which the impurity layers 16 and 18 will be formed by subsequent ion implantation. The side insulation layers and control gates will also be formed on the side surfaces of the aperture portions 160 and 180 by subsequent processing.

Figure 6:
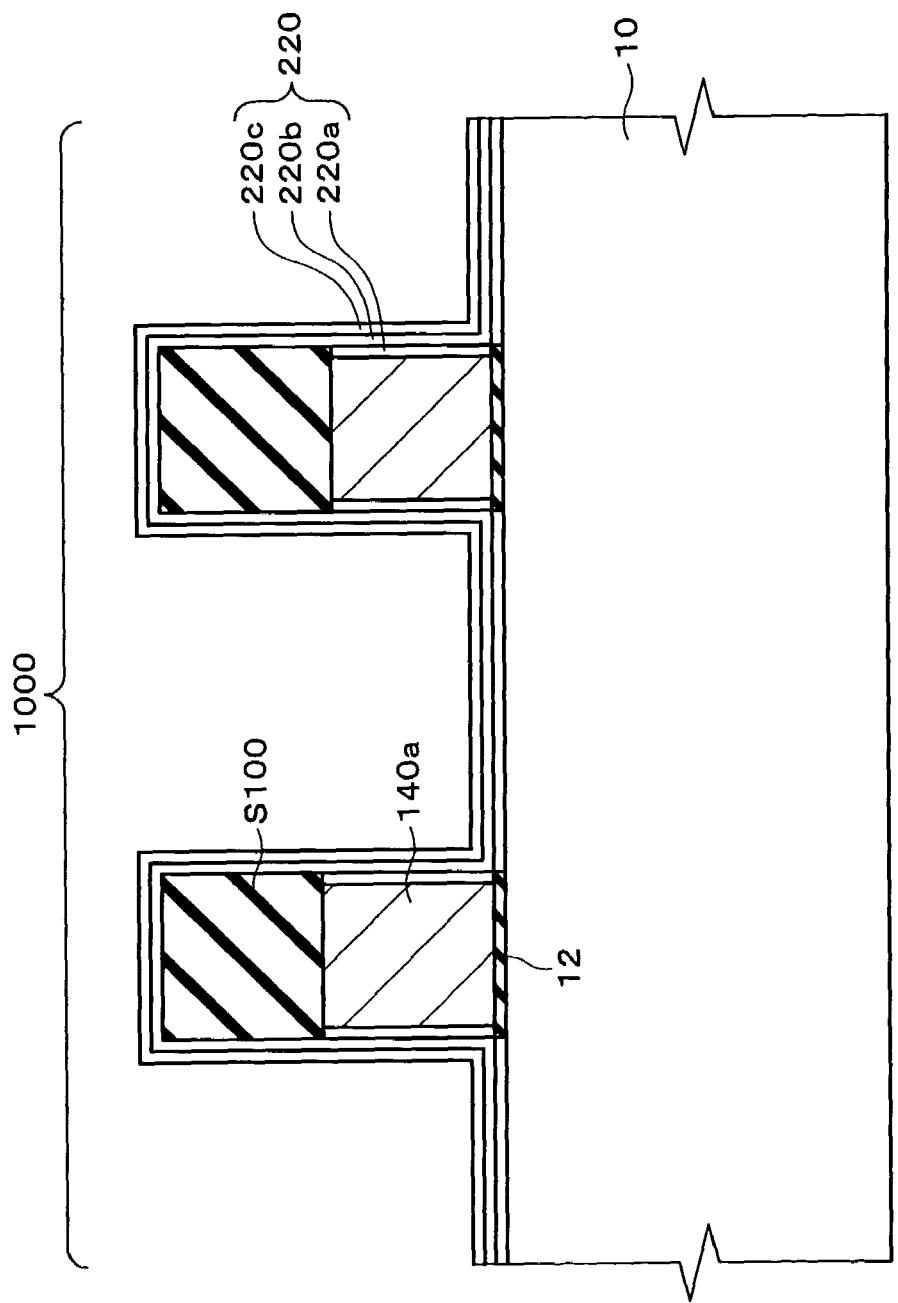
FIG. 6 is a sectional view of one step in the method of manufacturing the semiconductor device shown in FIGS. 1 and 2.

(3) Dilute hydrofluoric acid is then used to wash the surface of the semiconductor substrate 10. This removes the exposed insulation layer 120. A first silicon oxide layer 220a is then formed by a thermal oxidation method, as shown in FIG. 6. The first silicon oxide layer 220a is formed on the exposed surfaces of the semiconductor substrate 10 and the gate layer 140a. Note that the first silicon oxide layer 220a could also be formed by a CVD method.

Annealing is then performed on the first silicon oxide layer 220a. This annealing is performed in an environment including $NH_3$. This preprocessing facilitates the uniform deposition of a silicon nitride layer 220b above the first silicon oxide layer 220a. The silicon nitride layer 220b can be subsequently formed by a CVD method.

A second silicon oxide layer 220c is then formed by a CVD method, specifically by high-temperature oxidation (HTO). The second silicon oxide layer 220c can also be formed by using in-situ steam generation (ISSG). ISSG processing enables compact film formation. If the film is formed by ISSG processing, the ONO film 220 will be very compact so annealing can be omitted.

Note that forming the silicon nitride layer 220b and the second silicon oxide layer 220c in the same furnace in the above-described step makes it possible to prevent contamination of the boundary surfaces due to removal from the furnace. Since this enables the formation of a homogeneous ONO film 220, it enables the creation of a memory cell 100 with stable electrical characteristics.

In this embodiment of the invention, subsequent patterning creates the first insulation layer 22, the second insulation layer 24, and the side insulation layer 26 from the ONO film 220 (see FIG. 2).

Figure 7:
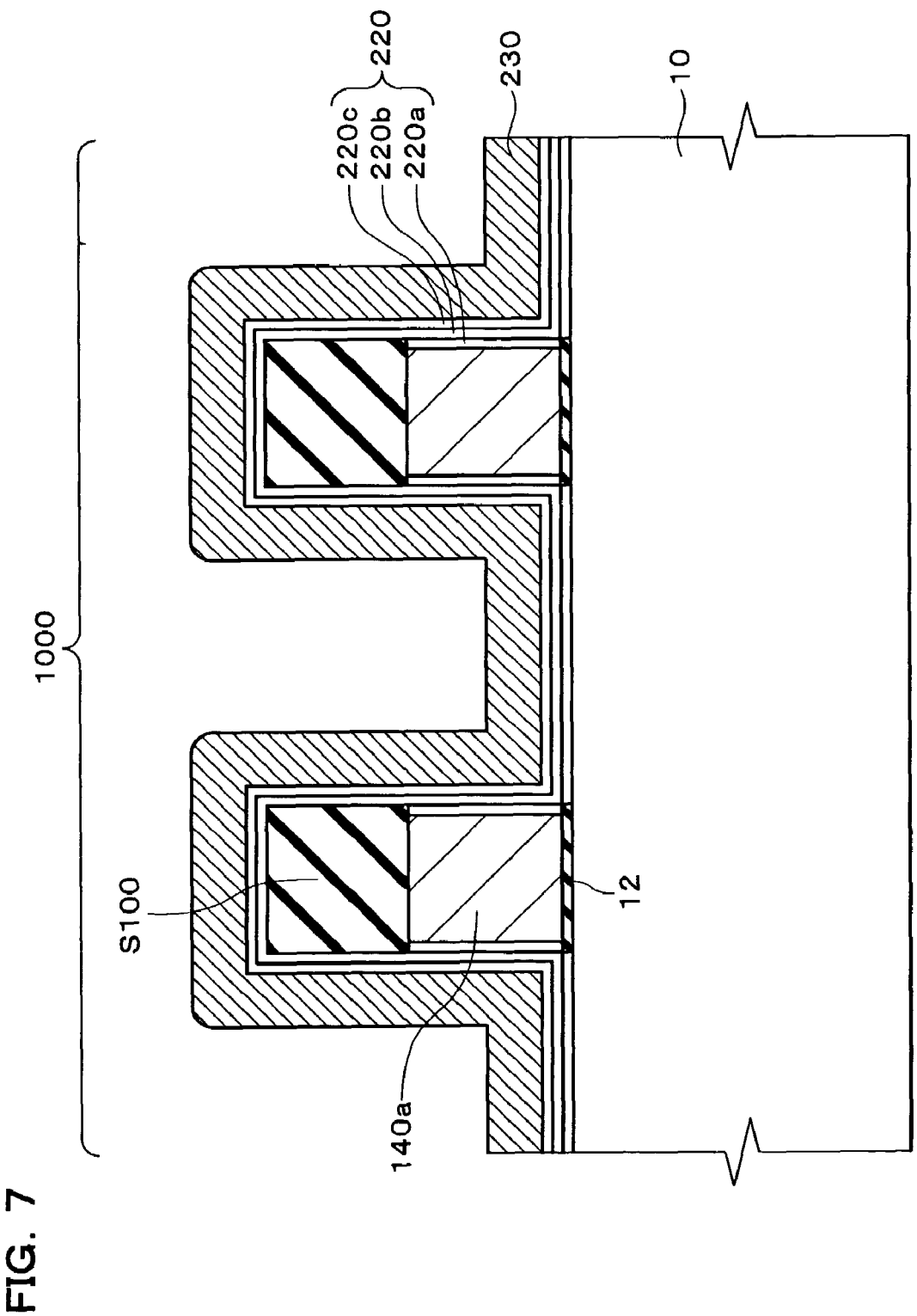
FIG. 7 is a sectional view of one step in the method of manufacturing the semiconductor device shown in FIGS. 1 and 2.

(4) As shown in FIG. 7, a doped polysilicon layer (second conductive layer) 230 is formed over the second silicon oxide layer 220c. The doped polysilicon layer 230 will become the conductive layer 40 (see FIG. 1) that forms the first control gates 20a and 30a, by subsequent etching.

Figure 8:
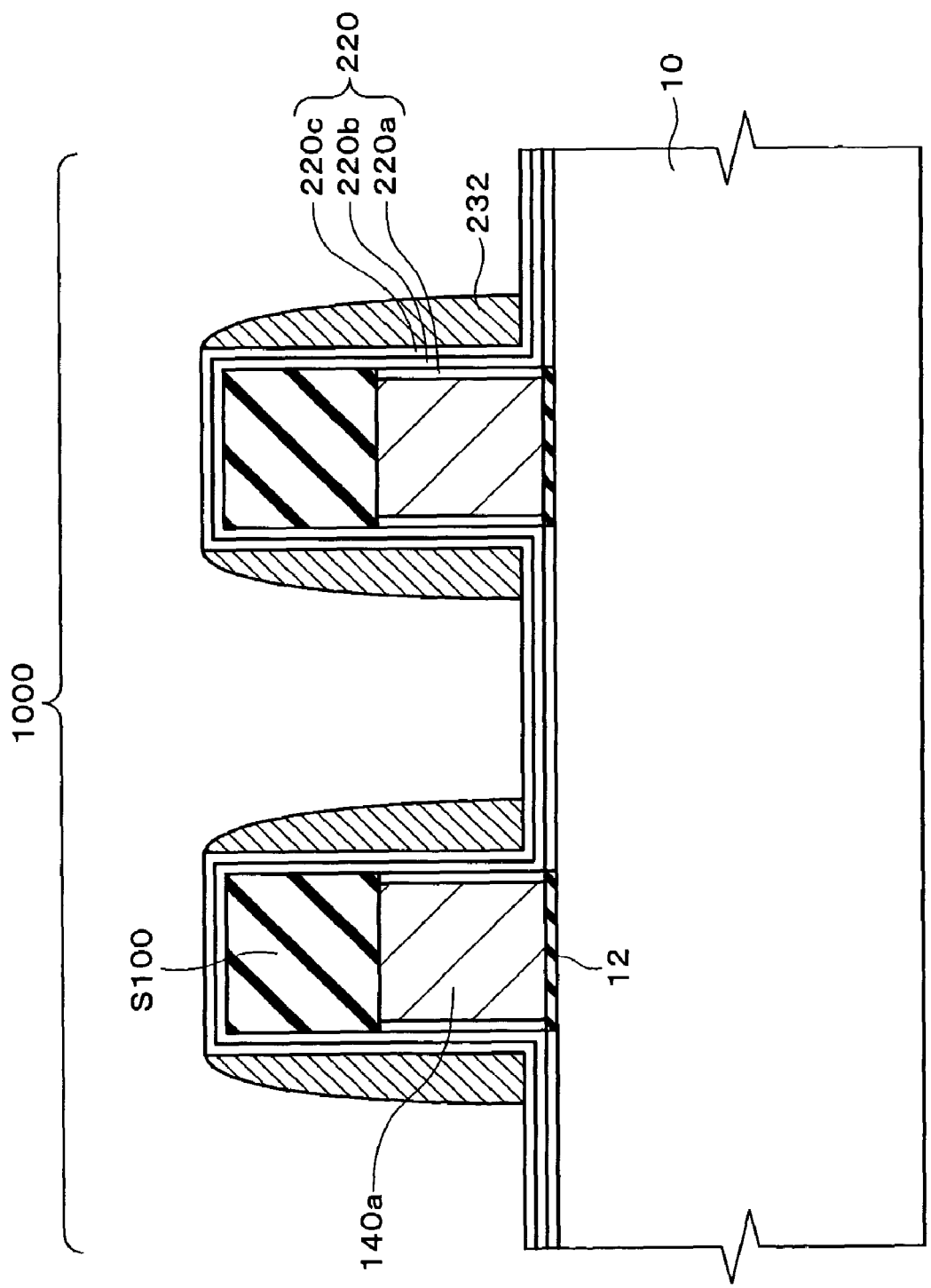
FIG. 8 is a sectional view of one step in the method of manufacturing the semiconductor device shown in FIGS. 1 and 2.

(5) As shown in FIG. 8, the entire surface of the doped polysilicon layer 230 is subjected to anisotropic etching. This forms a conductive layer 232 in the form of side walls along the side surfaces of the aperture portions 160 and 180 of the memory region 1000 (see FIG. 5).

Figure 9:
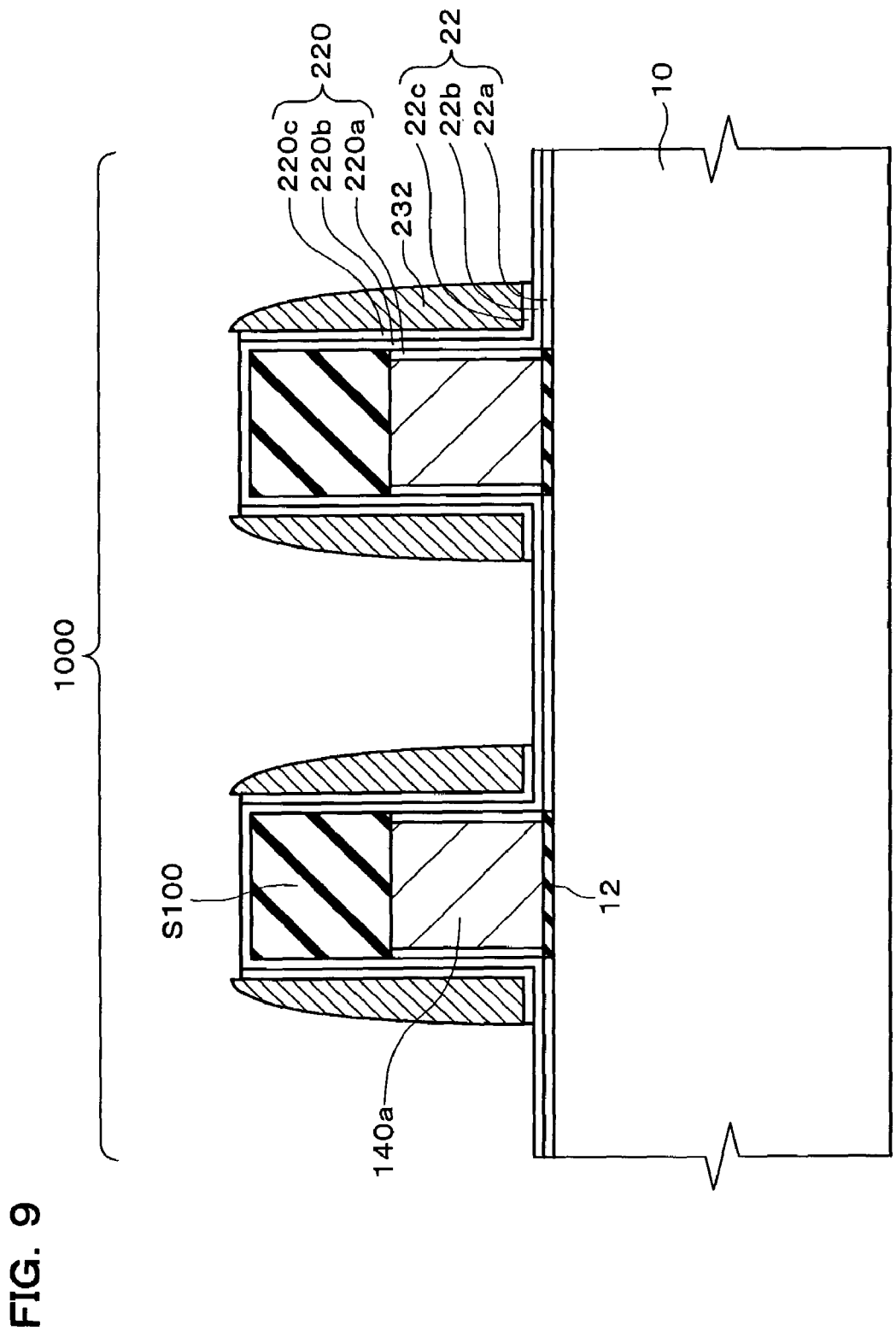
FIG. 9 is a sectional view of one step in the method of manufacturing the semiconductor device shown in FIGS. 1 and 2.

(6) Etching is then used to remove the natural oxide film that has formed on the surface of the side-wall-shaped conductive layer 232. Simultaneously with this etching step, or continuing after this etching step, the first control gates 20a and 30a are used as a mask to remove the second silicon oxide layer 220c part of the ONO film 220. This leaves the first insulation layer 22 that forms the ONO film underneath the first control gates 20a and 30a, as shown in FIG. 9.

Figure 10:
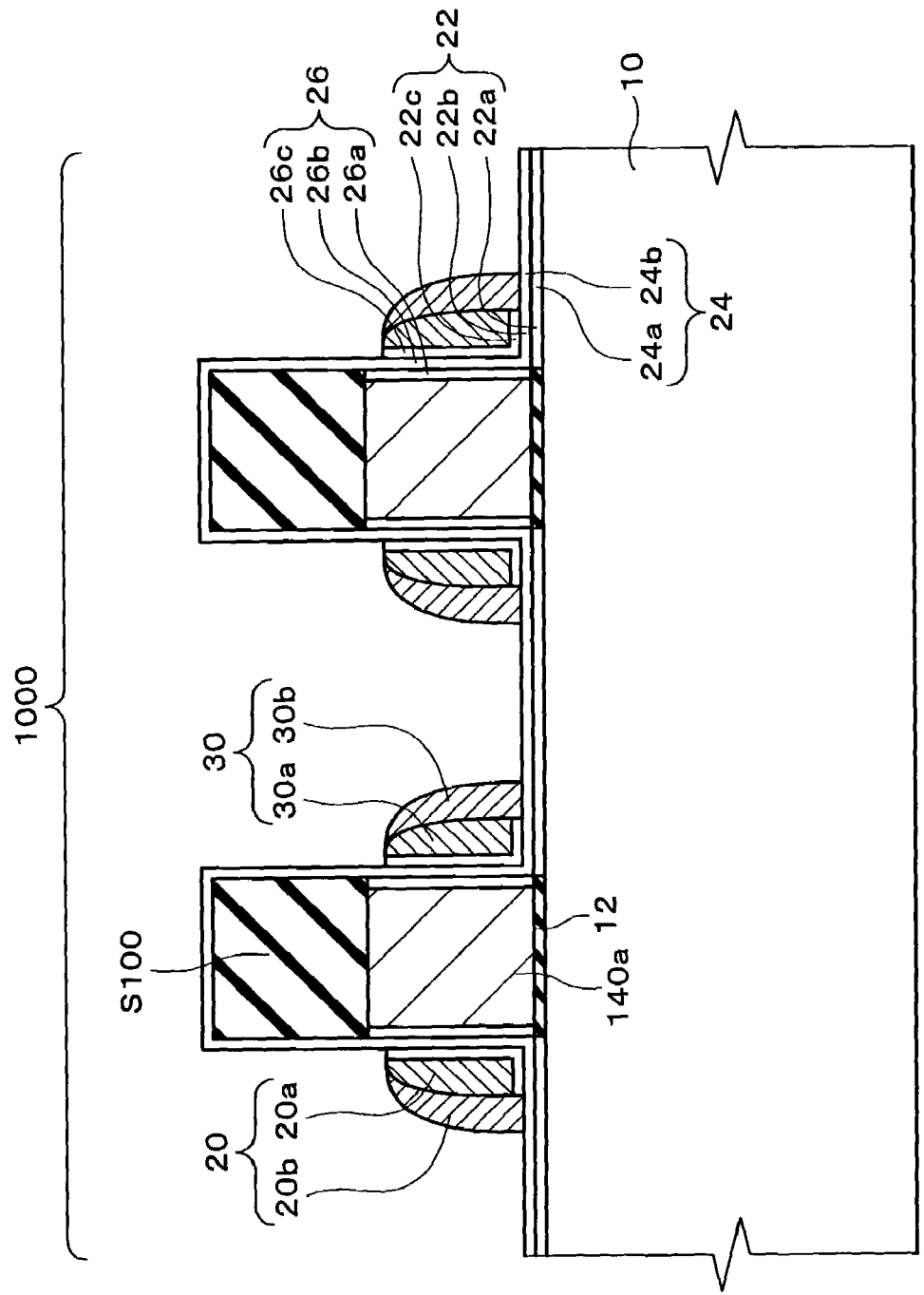
FIG. 10 is a sectional view of one step in the method of manufacturing the semiconductor device shown in FIGS. 1 and 2.

(7) A doped polysilicon layer (not shown in the figures) is then formed over the entire surface. The formation of the doped polysilicon layer is done without pausing after the processing of step (6) has ended, to prevent exposure of the substrate to the atmosphere. The doped polysilicon layer is subsequently removed from the entire surface by anisotropic dry etching. This etching is performed under conditions such that the etching selection ratio for silicon and silicon oxide (the silicon etching rate/the silicon oxide etching rate) is between 100 and 300. This enables the formation of the first control gates 20a and 30a by lowering the height of the conductive layers 232 in the form of side walls, and also the formation of the second control gates 20b and 30b above the second insulation layers 24 formed of the first silicon oxide layers 24a and the silicon nitride layers 24b, as shown in FIG. 10. Isotropic etching is then used to smooth the surfaces of the control gates 20 and 30. This also removes an exposed portion of the second silicon oxide layer 26c.

Figure 11:
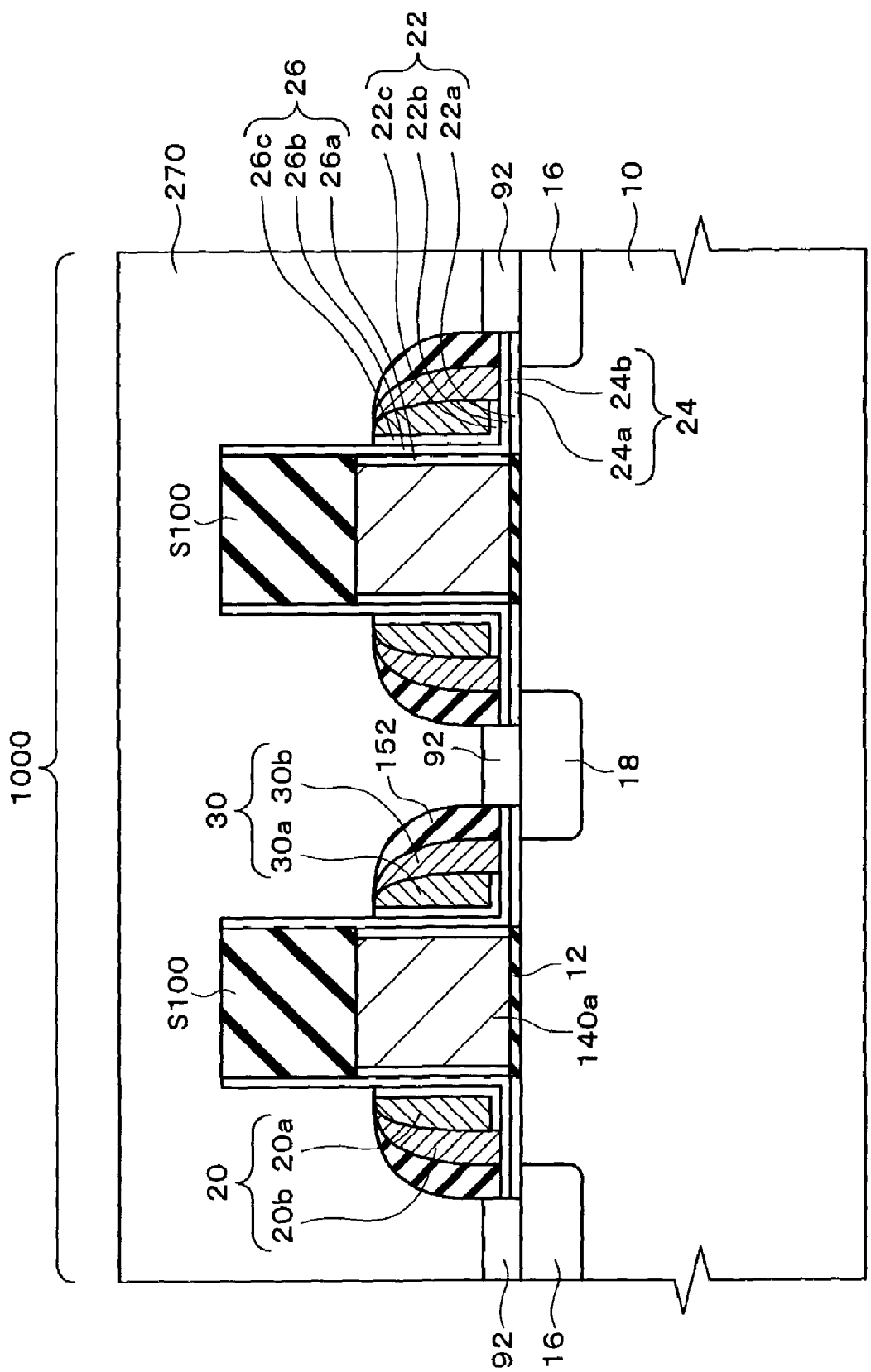
FIG. 11 is a sectional view of one step in the method of manufacturing the semiconductor device shown in FIGS. 1 and 2.

(8) An insulation layer of a material such as silicon oxide or silicon nitride oxide (not shown in the figures) is formed over the entire surface in the memory region 1000. The side-wall insulattion layer 152 that covers the control gates 20 and 30 is formed by anisotropic etching of this insulation layer, as shown in FIG. 11. This etching also removes the insulation layer deposited on the region in which the silicide layer will be formed by subsequent processing, to expose the semiconductor substrate.

Ions of an n-type impurity are then implanted to form the impurity layers 16 and 18 in the semiconductor substrate 10, as shown in FIG. 11.

A metal for forming a silicide is then deposited over the entire surface. The metal for forming the silicide could be titanium or cobalt, by way of example. The silicide layer 92 is then formed on the exposed surface of the semiconductor substrate 10 by a silicide reaction of the metal formed over the semiconductor substrate. A third insulattion layer 270 of a material such as silicon oxide or silicon nitride oxide is then formed over the entire surface of the memory region 1000. The third insulattion layer 270 is formed to cover the stopper layer S100.

Figure 12:
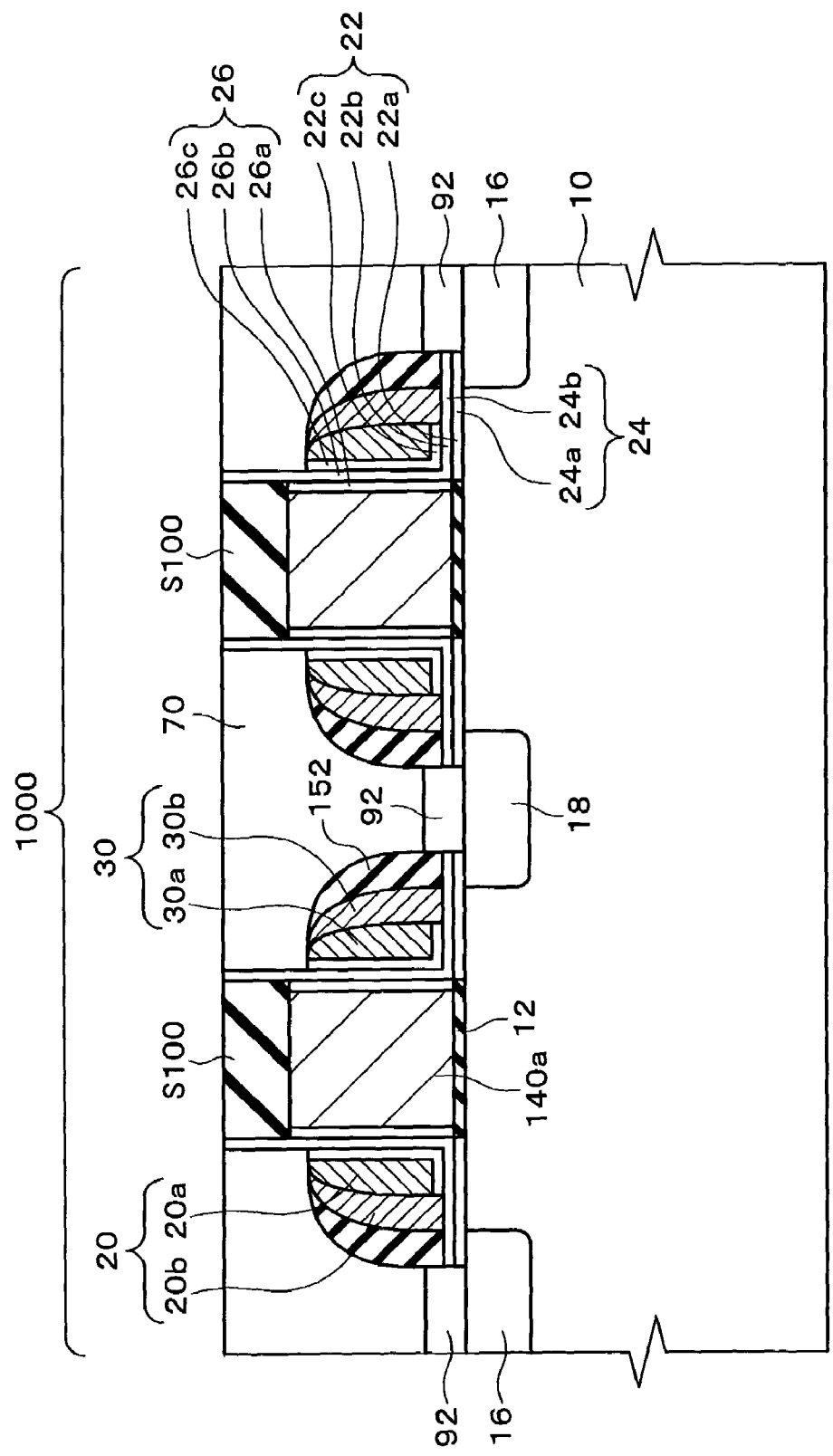
FIG. 12 is a sectional view of one step in the method of manufacturing the semiconductor device shown in FIGS. 1 and 2.

(9) As shown in FIG. 12, the third insulation layer 270 is polished by a CMP method far enough to expose the stopper layer S100, and the third insulattion layer 270 is made uniform. This polishing leaves the embedded insulation layer 70 between the opposing control gates 20 and 30.

Figure 13:
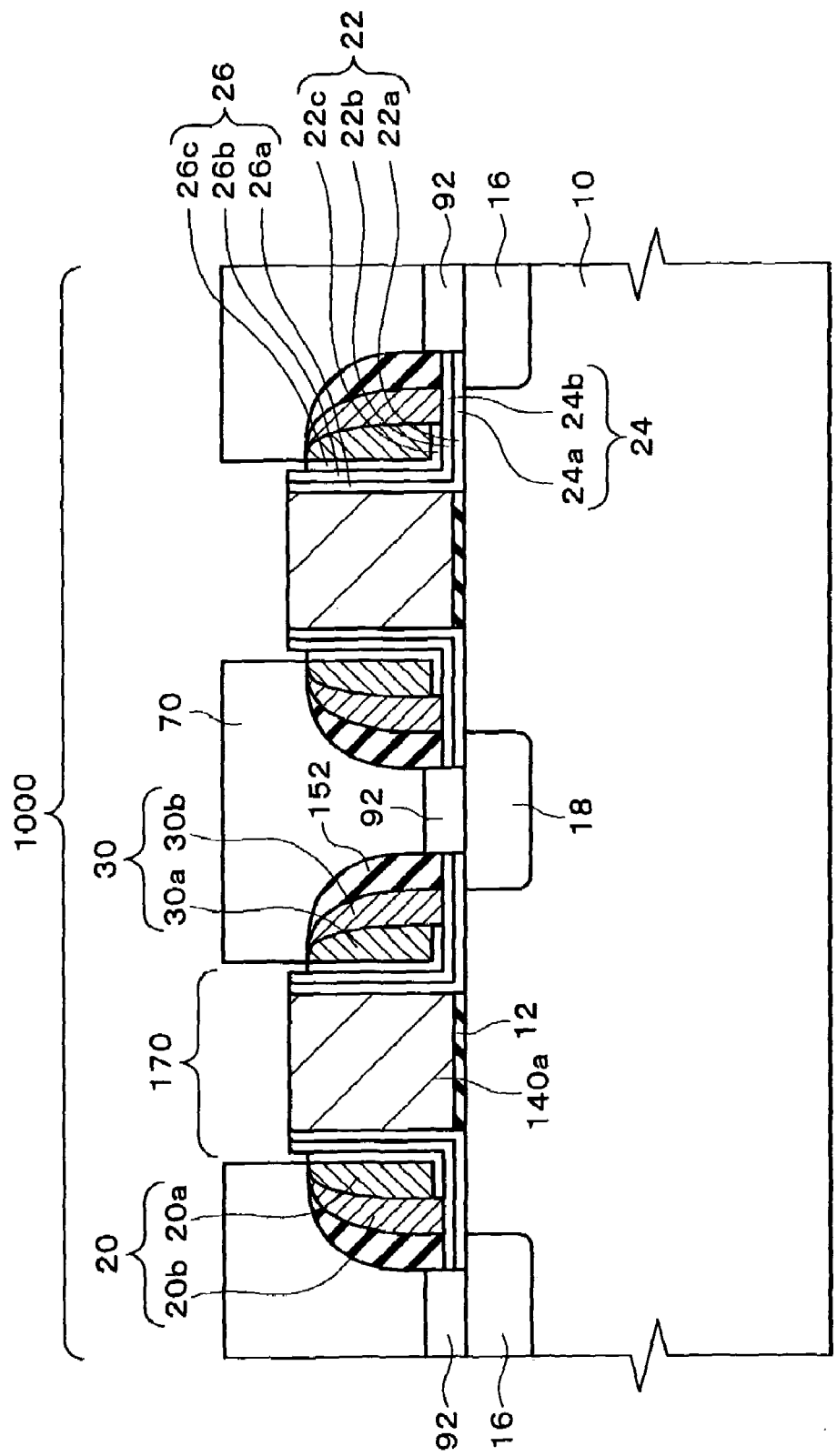
FIG. 13 is a sectional view of one step in the method of manufacturing the semiconductor device shown in FIGS. 1 and 2.
Figure 14:
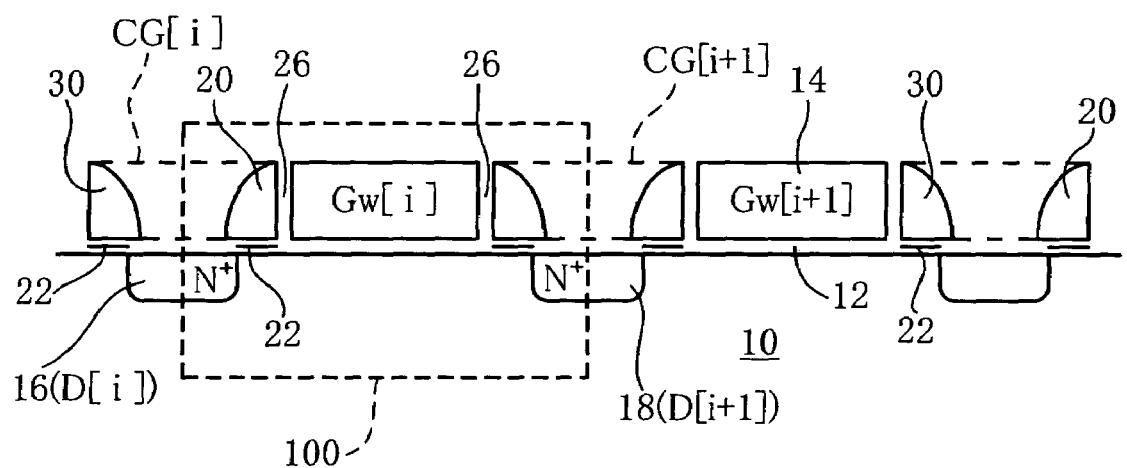
FIG. 14 is a section taken through a known MONOS type of memory cell.

(10) The stopper layer S100 is removed by hot phosphoric acid. As a result, at least the upper surface of the gate layer 140a is exposed to form an aperture portion 170 in the third insulattion layer 270, as shown in FIG. 13. In other words, this aperture portion 170 is a region formed by the removal of the stopper layer S100, positioned above the to gate layer 140a.

(11) A doped polysilicon layer (not shown in the figures) is subsequently formed over the entire surface. A resist layer (not shown in the figures) is formed by patterning this doped polysilicon layer. The resist layer is used as a mask to pattern the doped polysilicon layer and form the word line 50 (see FIG. 1).

The resist layer is then used as a mask to etch the gate layer 140a. This etching removes the part of the gate layer 140a that does not have the word line 50 formed thereabove. As a result, the word gates 14 can be formed in an array. The removed region of the gate layer 140a corresponds to the region in which a p-type impurity layer (impurity layer for element isolation) 15 will be formed subsequently.

Note that the control gates 20 and 30 are covered by the embedded insulation layer 70 so are not etched by this etching step and thus remain.

A p-type impurity is then doped into the entire surface of the semiconductor substrate 10. This forms the p-type impurity layer (impurity layer for element isolation) 15 in regions between the word gates 14 in the Y direction (see FIG. 1). This p-type impurity layer 15 provides reliable element isolation between adjacent memory cells 100.

The above steps enable the manufacture of the semiconductor device of FIGS. 1 and 2.

The advantages provided by the method of manufacturing a semiconductor device in accordance with this embodiment are described below.

Firstly, the control gates 20 and 30 are formed by a two-stage process. More specifically, the first control gates 20a and 30a are formed, then the second silicon oxide layer 220c of the ONO film 220 is removed and subsequently the second control gates 20b and 30b are formed. For that reason, the control gates 20 and 30 can be formed over insulation layers of different thicknesses. As a result, it becomes possible to manufacture a semiconductor device in which the field strengths of the control gates 20 and 30 and the substrate surface are non-uniform.

Secondly, the natural oxide film that has formed on the surface of the side-wall-shaped conductive layer 232 is removed in step (6), after the formation of the side-wall-shaped conductive layer 232. Thus the conductive layer that will form the second control gates 20b and 30b can be formed on a clean surface. This makes it possible to prevent the existence of any natural oxide films between the side-wall-shaped conductive layer 232 and the conductive layer that will form the second control gates 20b and 30b. In step (7), the etching is done with a high etching selection ratio for silicon and silicon oxide (the silicon etching rate/the silicon oxide etching rate). If any natural oxide film were to remain between the side-wall-shaped conductive layer 232 and the second control gates 20b and 30b, that natural oxide film would not be etched and would remain, making it difficult to control the height of the control gates 20 and 30. The manufacture method in accordance with this embodiment makes it possible to prevent this problem from occurring, enabling the formation of the desired control gates 20 and 30.

Thirdly, during the removal of the natural oxide film from the surface of the side-wall-shaped conductive layer 232 in step (6), the second silicon oxide layer 220c of the ONO film 220 is also removed simultaneously. This makes it possible to prevent any increase in the number of processing steps.

Fourthly, since steps (6) and (7) are performed in quick succession without exposure of the substrate 10 to the atmosphere, the conductive layer for the second control gates 20b and 30b can be formed reliably on a clean surface. In addition, the etching performed in steps (6) and (7) is dry etching, which has the result of enabling the formation of desired control gates.

The present invention was described above with respect to one embodiment thereof, but the present invention is not limited thereto and thus there are various different modifications thereto within the scope of the invention laid out herein. For example, a semiconductor substrate in bulk form was used as the semiconductor layer in the above described embodiment, but it is equally possible to use a semiconductor layer of a SOI substrate.

What is claimed is:

1. A method of manufacturing a semiconductor device comprising a memory region in which non-volatile memory devices are arranged in a matrix form of a plurality of rows and a plurality of columns to form a memory cell array, the method of manufacturing a semiconductor device comprising the steps of:
   (a) forming a gate insulation layer above a semiconductor layer;
   (b) forming a first conductive layer above the gate insulation layer;
   (c) forming a stopper layer above the first conductive layer;
   (d) patterning the stopper layer and the first conductive layer, to form a stack of layers formed of that stopper layer and that first conductive layer;
   (e) forming a first insulation layer at least over the semiconductor layer and both side surfaces of the first conductive layer;
   (f) forming a second conductive layer over an entire surface of the memory region, and forming a first control gate in the form of a side wall on each of two opposed side surfaces of the first conductive layer, with the first insulation layer interposed with respect to the semiconductor layer, by anisotropic etching of the second conductive layer;
   (g) removing oxide films from a surface of the first control gate;
   (h) using the first control gate as a mask to remove part of the first insulating layer, and defining part of the remaining first insulating layer under the removed portion as a second insulating layer;
   (i) forming a third conductive layer over the entire surface of the memory region;
   (j) forming a second control gate on a side surface of the first control gate, with the second insulation layer interposed with respect to the semiconductor layer, by anisotropic etching of the third conductive layer;
   (k) forming an impurity layer to be a source region or a drain region within the semiconductor layer;
   (l) forming a third insulation layer over the entire surface of the memory region then removing the third insulation layer to expose at least part of the stopper layer; and
   (m) removing the stopper layer, then forming a fourth conductive layer and patterning the fourth conductive layer to form a word line.

2. The method of manufacturing a semiconductor device as defined by claim 1,
   wherein step (g), step (h), and step (i) are performed in sequence, without exposing an object being processed to the atmosphere.

3. The method of manufacturing a semiconductor device as defined by claim 1,
   wherein step (j) comprises etching the first control gate.

4. The method of manufacturing a semiconductor device as defined by claim 1,
   wherein the third insulation layer is removed in step (l) by polishing.

5. The method of manufacturing a semiconductor device as defined by claim 1,
   wherein the first insulation layer is a stack of a first silicon oxide film, a silicon nitride film, and a second silicon oxide film.

6. The method of manufacturing a semiconductor device as defined by claim 1,
   wherein the second insulation layer is a stack of a silicon oxide film and a silicon nitride film.

* * * * *